Feb. 10, 1970 L. E. AVIS 3,494,803
METHOD OF BONDING A SEMI-CONDUCTOR TO A
METAL CONDUCTOR AND RESULTANT PRODUCT
Filed May 12, 1966

INVENTOR
Leonard E. Avis

BY Littlepage & Quaintance
ATTORNEYS

United States Patent Office 3,494,803

Patented Feb. 10, 1970

3,494,803

METHOD OF BONDING A SEMI-CONDUCTOR TO A METAL CONDUCTOR AND RESULTANT PRODUCT

Leonard E. Avis, Baltimore, Md., assignor, by mesne assignments, to Teledyne, Inc., Los Angeles, Calif., a corporation of Delaware Filed May 12, 1966, Ser. No. 549,538

Int. Cl. H01v *1/28, 1/14*

U.S. Cl. 136—237 17 Claims

Figure 1:
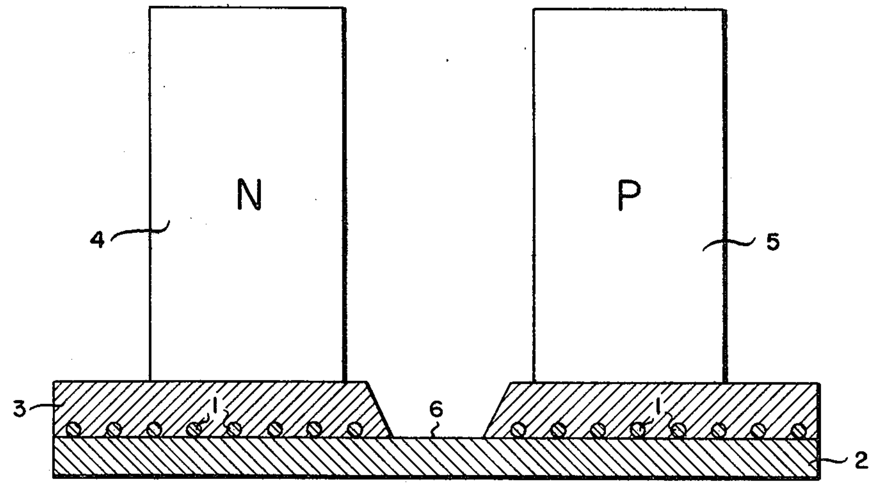

This invention relates to forming improved bonds between semiconductor or thermoelectric elements and a common metal conductor which have much better electrical and physical properties at high temperatures. More particularly the invention relates to an economical method of forming an unusually strong, durable, low electrical resistance dovetail-transition bond between semiconductor elements or thermoelectric elements and metal conductors.

When rods of dissimilar thermoelectric compositions have their ends joined to form a continuous loop, two thermoelectric junctions are established between the respective ends so joined. If the two junctions are maintained at different temperatures, an electromotive force will be created in the circuit thus formed. This effect is known as the thermoelectric or Seebeck effect, and may be regarded as due to the charge carrier concentration gradient produced by a temperature gradient in the two materials. The effect cannot be ascribed to either material alone, since two dissimilar, thermoelectrically complementary materials are necessary to obtain this effect. It is therefore customary to measure the Seebeck effect produced by a particular material by forming a thermocouple in which one circuit member or thermoelement consists of this material, and the other circuit member consists of a metal such as copper or lead, which has negligible thermoelectric power. The thermoelectric power Q of a material is the open circuit voltage developed by the above thermocouple when the two junctions are maintained at a temperature difference of 1° C.

When thermal energy is converted to electrical energy by thermocouple devices utilizing the Seebeck effect, each device may be regarded as a heat engine operating between a heat source at a relatively hot temperature $T_H$ and a heat sink at a relatively cold temperature $T_C$. The limiting or maximum efficiency theoretically attainable from any heat engine is the Carnot efficiency, which is $$\frac{T_H - T_C}{T_H}$$

Thus it is well known that the efficiency of Seebeck effect devices is increased by increasing the temperature difference between the hot junction temperature $T_H$ and the cold junction temperature $T_C$. It is convenient to operate such Seebeck devices with the cold junction at room temperature or at as low a temperature as possible, but for any given cold junction temperature it follows that high efficiency in the conversion of thermal energy to electrical energy requires that the hot junction temperature $T_H$ be as high as possible.

Many thermoelectric compositions which are useful at relatively low temperature cannot be operated at elevated temperatures because they tend to break down physically or chemically react with the environment when exposed to relatively high temperatures. It is therefore necessary that highly efficient Seebeck devices utilize only those thermoelectric compositions which are stable at elevated temperatures. In the same manner all of the components of a thermoelectric device in contact with the high temperature source, including the hot shoe bond between the thermoelements, must operate effectively at the highest temperatures possible in order to (1) maintain the highest temperature difference possible between the hot junction temperature $T_H$ and the cold junction temperature $T_C$; (2) maintain a continuous electrical circuit between the components for extended periods of time; and (3) maintain the lowest electrical resistivity in the components and in the thermoelectrical system as a whole in order to generate the large currents necessary for high heat conversion efficiency.

In the discussion that follows and in the claims the common conductor that connects the thermoelements on the end exposed to the heat source will be referred to interchangeably as the hot shoe and as the common conductor. The thermoelements may be made of any of the known formulations of thermoelectrically complementary materials used in this art. The term thermoelectrically complementary preferably refers to known N-type and P-type semiconductor elements which form effective thermoelectric devices, but non semiconductor materials could be used. The composition of the thermoelements and the methods of doping semiconductor thermoelements materials are well known in this art.

In most prior art thermoelectric devices the junction bonds between the metal conductor and the thermoelectrically complementary elements physically and chemically decompose at high temperatures and the normally relatively high electrical and thermal resistance at the bonded junctions tend to rapidly increase to higher levels as the operating temperature increases. Such thermoelectrical devices do not operate satisfactorily for long periods of time. Conventional brazing or soldering materials contaminate the thermoelements, thereby substantially reducing their efficiency. When the metal conductor is directly bonded to a semiconductor, phase changes occur in the metal as the temperature enters different temperature zones and generally a chemical bond effected in one phase loses its effectiveness in another phase. Further, differences in expansion and contraction with temperature variations between the metal elements and semiconductor elements cause such direct bonds to physically deteriorate very rapidly at high temperatures. Still further, when iron is bonded directly with a doped semiconductor it rapidly corrodes at high temperatures.

A complete analysis of the causes of bond deterioration is rather complex due to the many materials which can be present at the bonding interfaces, especially if solders are used. However, it is certain that the main problem stems from the various materials being chemically and/or physically incompatible with each other. The higher the temperature of operation, the more severe the interaction and hence the degradation becomes.

An important object of this invention is to provide an economical method for mass producing semiconductor and thermoelectric devices with durable bonds between the semiconductor thermoelectric elements and the common metal conductor which have good electrical, chemical and physical properties at relatively high temperatures.

Another important object of this invention is to provide more efficient thermoelectric devices which have a longer life at high operating temperatures.

Another important object of this invention is to provide a common conductor or hot shoe that combines the advantages of good electrical and thermal conduction of a metal shoe and the good long lasting bond of a semiconductor shoe.

Other objects and advantages of this invention will be apparent to those skilled in the art after studying the following description and drawings.

In accordance with this invention it has been discovered that the use of a transition bond which makes a gradual composition transition from the metal composition at the metal shoe end of the bond to the semiconductor composition or thermoelement composition at the thermoelement end of the bond and which is chemically and physically similar to the metal in the metal shoe and the semiconductor or other thermoelement composition in the thermoelement provides an efficient, stable high temperature bond between these dissimilar element materials.

Further in accordance with this invention it has been discovered that semiconductor elements and thermoelements having transition bonds of unusually high physical strength can be mass produced much more economically using a fluid-screen-to-metal bonding technique described below. Both the product and the method of forming the product are important features of this invention.

Figure 2:
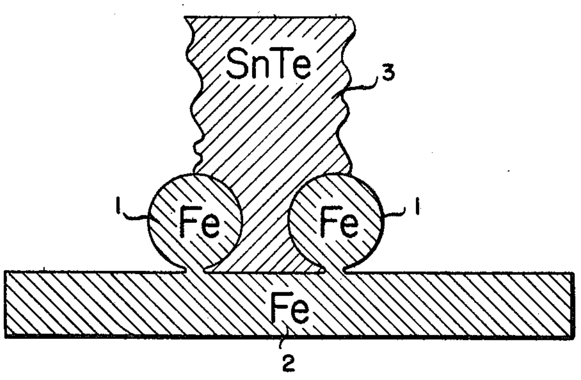

In the drawings:

FIGURE 1 shows a typical thermoelectric device in accordance with the principles of this invention; and FIGURE 2 is an enlarged view of a cross section of the transition bond which shows the dovetail joint between the fused metal screen and neutral semiconductor material.

In a preferred embodiment of this invention shown in FIGURE 1 a metal mesh screen 1 is fused to a common conductor 2, which is the same or a similar type metal as the metal composition of said screen. Embedded in and covering said screen 1 is a substantially neutral semiconductor material 3. Joined to the semiconductor material 3 are semiconductor thermoelements of N-type 4, and P-type 5. A diffusion barrier 6 formed by cutting away a center section of semiconductor material 3 and screen 1 until the bare metal is visible completes the thermocouple device.

The transition bond formed by the metal screen 1 and the neutral semiconductor material 3 provides a gradual composition transition from the metal conductor shoe 2 to the semiconductor thermoelements 4 and 5. The transition layer comprises a semiconductor material layer 3, which is preferably neither P nor N-type but substantially neutral in nature, and a layer which comprises both substantially neutral semiconductor material 3 and the fused metal screen 1. While in the preferred embodiment illustrated in the drawings, this latter layer is shown as comprising approximately 50% semiconductor material 3 and 50% fused metal screen 1, it will be apparent that the relative proportions of these materials therein may be altered to optimize performance of various specific embodiments of the invention described herein. Additionally, the proportion of metal to semiconductor in contact with the metal shoe can be modified as desired. In this fused metal-neutral semiconductor layer a series of dovetail-like joints are formed. Together the composite strength of all of these dovetail-like bonds produces an unusually strong and lasting physical bond.

FIGURE 2 shows an enlarged view of this dovetail feature and the transition bond. In a preferred embodiment illustrated in the drawings, the screen 1 is made of iron fused to a common conductor 2, also made of iron. Other suitable materials may alternately be employed for these purposes such as, for instance, alloys of iron, stainless steel, molybdenum and other refractory metal and alloys thereof. Preferably the screen and conductor are made of the same metal, but different compatible metals could be used, such as an iron screen with a stainless steel common conductor. In a preferred embodiment illustrated in the drawings, the neutral semiconductor 3, symbolized by SnTe forms a dovetail-like area that physically enhances the strength of the overall bond between the metal common conductor or shoe 2 and the semiconductor thermoelements 4 and 5. It has been found that SnTe forms an excellent bond with iron; however, other materials may be utilized for the substantially neutral semiconductor material 3 as long as they are compatible for use with the materials from which the other members of that device are formed. For instance, an undoped PbTe neutral semiconductor material 3 could be employed with a screen 1 and the common conductor 2 formed of iron and doped lead telluride thermoelectric elements 4 and 5. Also, in certain applications, it will be desirable to utilize a germanium telluride neutral semiconductor material with a molybdenum screen and common conductor.

In a preferred embodiment illustrated, the metal portion in the layer of the transition bond adjacent the common conductor 2 takes the form of a screen which produces a dovetail effect with the substantially neutral semiconductor material 3 present in the same layer. This dovetail effect may take other forms in alternate embodiments of the invention and still effect the same function which is to produce a mechanical locking between the semiconductor material and the metal portions of the layer to supplement the strength of the metallurgical bond therebetween. This same dovetail type of mechanical interlocking effect can be obtained by utilizing a perforated metal plate or a sheet of expanded metal for the screen 1 or by fusing metal particles of various shapes to the common conductor. This mechanical locking between a joining material and one of two elements to be joined together obviously has utility in conventional structures wherein a thermoelectric element is joined to a hot shoe without utilizing a neutral semiconductor layer. Illustrative of this aspect, one prior art process for joining a lead telluride thermoelectric element to an iron hot shoe is to bond the two components together utilizing a brazing operation employing a lead tin alloy. The strength of the bond between the thermoelectric element and hot shoe can be increased by initially fusing, for instance, an iron screen to the iron shoe element prior to the brazing operation. Such a technique produces a dovetail joint between the screen and braze material thereby enhancing the strength of the bond between the thermoelectric element and the shoe.

The following example illustrates a preferred embodiment of the fused-screen-to-metal bonding technique outlined above and preferred thermoelectric components. The numbers set forth in this example correspond with those shown in the drawings.

A 35 mesh iron screen 1 was fusion bonded under pressure to a 1/16" iron sheet 2 in a hydrogen furnace at 2100° F. for 48 hours. SnTe powder of less than 100 mesh was cold pressed into and over the bonded sheet at 25 t.s.i. to form the substantial neutral layer 3 of the transition bond. Approximately one-half of the SnTe is embedded in the mesh of screen 1, the other half lies above the mesh. The size of the surface area of the composite slab may be varied as desired. The composite slab obtained may be cut into smaller pieces to make a number of smaller hot shoes. The size of the hot shoe may be varied as desired. An N-type thermoelement 4, consisting of PbTe doped with $PbI_2$, was bonded directly to the SnTe layer by hot pressing at 1425° F., at 2 t.s.i. for 20 minutes. A P-type element 5, consisting of AgSbTe-GeTe, was bonded to the SnTe layer in a similar manner with the addition of a small amount of Te at the interface, at 1180° F. 200 at 1.2 t.s.i. for 5 minutes. The addition of Te at the interface merely wetted the surface; the excess evaporated. Diffusion barrier 6 was made by cutting away a center section of the transition bond, including the screen, until the bare metal was visible.

This thermoelectric device was subjected to eighty thermocycles in which the temperature of the hot shoe was varied cyclically between 200° and 1000° F. On examination there was no visible evidence of physical or chemical decomposition of the bond.

The specific example set forth above used powdered SnTe, but molten SnTe could have been used with equal success and/or other materials compatible with the semiconductor thermoelements could have been substituted for SnTe. In either case the SnTe or its substitute is allowed to solidify on the screen, then it is remelted to form a fused bond with the thermoelements which preferably have a higher melting point than the SnTe. The remelting step is important since it prevents the formation of entrapped gas bubbles under the thermoelectric elements. In place of the metal mesh screen one could substitute a perforated metal plate and the specific mesh size of the screen or the perforated plate can be varied as desired. Substituting loose fused metal fibers for the screen reduces the dovetailed bond effect; substituting powdered metal would eliminate it. The metallic material used should be compatible with the neutral semiconductor or transition material that it is in direct contact with. However, it is also possible, in view of the dovetail bond effect, to use a fused metal mesh that is incompatible with the neutral semiconductor material in the transition layer, but better results and stronger bonds are obtained when compatible mesh and neutral semiconductor materials are used. When compatible materials, such as SnTe and iron mesh, are used the adhesion of these compatible materials greatly adds to the overall bond strength and serves as a corrosion protector and resists chemical poisoning of the various elements.

The dovetail-transition bond of this invention has for the sake of illustration been discussed in regard to its use in thermoelectric devices; it should also be noted that it can be used to bond semiconductor elements to metal elements in other types of semiconductor devices.

It should also be reemphasized that the specific metal used in the conductor or hot shoe and in the screen, and the specific neutral semiconductor and thermoelectric P and N type semiconductor materials used in conjunction with the dovetailed-transition bond of this invention may readily be varied by one skilled in the art. Many adequate substitutes are known. The specific materials set forth in the above examples proved to be very durable and effective. Obviously other fusion forming temperatures and pressures could be used with the specific materials set forth in the example and the suitable temperature ranges and pressure ranges that may be used will vary with the materials. Also, regardless of the field of use, it will be apparent the transition region should be kept as small, or narrow, as possible and yet obtain the necessary or desired buffer zone function which, for instance, avoids instability of the bond during wide variations in temperature and/or contamination. Normally the transition region, at most, represents a small percentage of the total mass of materials being bonded or laminated.

What is claimed is:

1. A thermoelectric device for high temperature use comprising two thermoelements of thermoelectrically complementary material, said thermoelements being joined at one end by a common metal conductor to form a high temperature thermoelectric junction by means of a transition bonding material including a metal and a substantially neutral semiconductor which is arranged to make a gradual transition from the common composition of the metal conductor to the composition of the complementary thermoelectric elements.

2. The thermoelectric device of claim 1, wherein said complementary thermoelement materials are P- and N-type semiconductor materials and said transition bonding material gradually changes from a substantially neutral semiconductor material in contact with said thermoelements to a mixture of substantially neutral semiconductor material and metal in contact with said metal conductor.

3. The thermoelectric device of claim 2, wherein said metal in said transition bond is the same as the metal in said common conductor.

4. The thermoelectric device of claim 2, wherein said metal in said transition bond is a metal mesh screen fused to said common metal conductor.

5. The thermoelectric device of claim 2, wherein said metal constitutes at least one member fused to said common metal conductor and forms a mechanical interlock with said neutral semiconductor.

6. The thermoelectric device of claim 4, wherein said fused metal mesh screen is embedded with said neutral semiconductor material so that a series of dovetail-like joints are formed.

7. The thermoelectric device of claim 6, wherein said screen is iron, and said neutral semiconductor is SnTe.

8. The thermoelectric device of claim 7, wherein approximately half of said neutral semiconductor material is embedded in said screen, and approximately one half overlies said screen.

9. A semiconductor device in which a semiconductor element is joined to a metal conductor by a bonding material, the improvement comprising a bonding material including a metal and a substantially neutral semiconductor which is arranged to make a gradual transition from the composition of the metal conductor to the composition of the semiconductor element.

10. The semiconductor device of claim 9 wherein said transition bonding material gradually changes from a substantially neutral semiconductor material in contact with said semiconductor to a mixture of substantially neutral semiconductor and metal in contact with said metal conductor.

11. A method of forming a laminated transition bonding surface between a conductor and a thermoelectric element comprising fusing a metal mesh screen material to a metal conductor, embedding and overlaying said screen material with a substantially neutral semiconductor material.

12. The method of claim 11, wherein said neutral semiconductor overlayer is fused to N- and P-type semiconductor elements.

13. The method of claim 11, wherein said screen and said common conductor are iron, and said neutral semiconductor is SnTe.

14. The method of claim 11, wherein said laminated conductor is cut into a series of smaller laminated conductors.

15. The method of claim 11, wherein said metal screen is a perforated metal plate.

16. A method of bonding a metal conductor to a doped semiconductor comprising bonding a layer containing a mixture of neutral semiconductor material and metal to said metal conductor surface, bonding said metal-neutral semiconductor layer with an overlayer of substantially neutral semiconductor material, and bonding said overlayer of neutral semiconductor material to a doped semiconductor surface.

17. A method of bonding a metal conductor to a semiconductor element comprising the steps of fusing a metal screen to said metal conductor, producing a molten layer of substantially neutral semiconducting material over said metal conductor and over and around said screen and extending above said screen, solidifying said layer, positioning said semiconductor element on said solidified layer, remelting said layer and re-solidifying said layer to bond said semiconductor element to said metal conductor.

References Cited

UNITED STATES PATENTS

| | | | |
|---|---|---|---|
| 1,221,561 | 4/1917 | Meyer | 29—191.4 |
| 2,357,578 | 9/1944 | Brownback | 29—191.4 |
| 2,496,346 | 2/1950 | Haayman et al. | 136—237 X |
| 3,232,719 | 2/1966 | Ritchie | 136—201 |
| 3,238,614 | 3/1966 | Intrater | 29—573 X |
| 3,352,650 | 11/1967 | Goldstein | 29—191.4 X |
| 3,364,079 | 1/1968 | Garno et al. | 136—237 |
| 1,947,894 | 2/1934 | Whitworth | 29—471.1 X |

ALLEN B. CURTIS, Primary Examiner

U.S. Cl. X.R.

29—471.3, 573